(12) United States Patent
Hsu

(10) Patent No.: US 6,484,289 B1
(45) Date of Patent: Nov. 19, 2002

(54) PARALLEL DATA TEST FOR A SEMICONDUCTOR MEMORY

(75) Inventor: Kuo-yuan Hsu, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/404,663

(22) Filed: Sep. 23, 1999

(51) Int. Cl.$^7$ ................................................. G06F 7/02
(52) U.S. Cl. ..................................................... 714/820
(58) Field of Search ................................ 714/718, 820, 714/726, 719, 710, 733, 736, 711, 723; 365/51, 200–201, 230.03, 225.7, 233, 63, 189.05, 189.07; 327/328.534, 327; 257/209, 529, 32; 324/73.1; 702/108

(56) References Cited

U.S. PATENT DOCUMENTS

| | | | |
|---|---|---|---|
| 4,862,067 A | * 8/1989 | Brune et al. | 324/73.1 |
| 5,173,906 A | * 12/1992 | Dreibelbis et al. | 714/733 |
| 5,936,901 A | * 8/1999 | Wong et al. | 365/189.07 |
| 6,009,026 A | * 12/1999 | Tamlyn et al. | 365/189.07 |
| 6,058,495 A | * 5/2000 | Lee et al. | 365/201 |
| 6,154,860 A | * 11/2000 | Wright et al. | 365/201 |
| 6,314,011 B1 | * 11/2001 | Keeth et al. | 365/51 |

OTHER PUBLICATIONS

NN7806256 (Parity Checking of ROS Input Word. Jun. 1978; IBM Technical Bulletin Disclosure;Jun. 1, 1978).*

Sakuta et al. (Circuit techniques for multi–bit parallel testing of 64 Mb DRAMs and beyond; IEEE, pp.: 60–61, Jun. 4–6, 1992).*

* cited by examiner

*Primary Examiner*—Albert Decady
*Assistant Examiner*—Guy Lamarre
(74) *Attorney, Agent, or Firm*—Robby T. Holland; Wade James Brady, III; Frederick J. Telecky, Jr.

(57) ABSTRACT

A semiconductor memory device having a parallel data test scheme is disclosed. The semiconductor memory includes an array that is partitioned into array portions with each array portion further divided into sub-arrays and banks. Each array portion providing data bits to a data compression circuit. The data compression circuit includes data compare sections and ripple sections. The data compare sections include data compare circuits that compare the data bits provided by each array portion and each provide a compare output to the ripple sections. The ripple sections are coupled together in series and provide global data compare outputs. A multiplexer selects between a data bit and the global data compare outputs to provide either a data output or a data comparison output to the output pin.

12 Claims, 6 Drawing Sheets

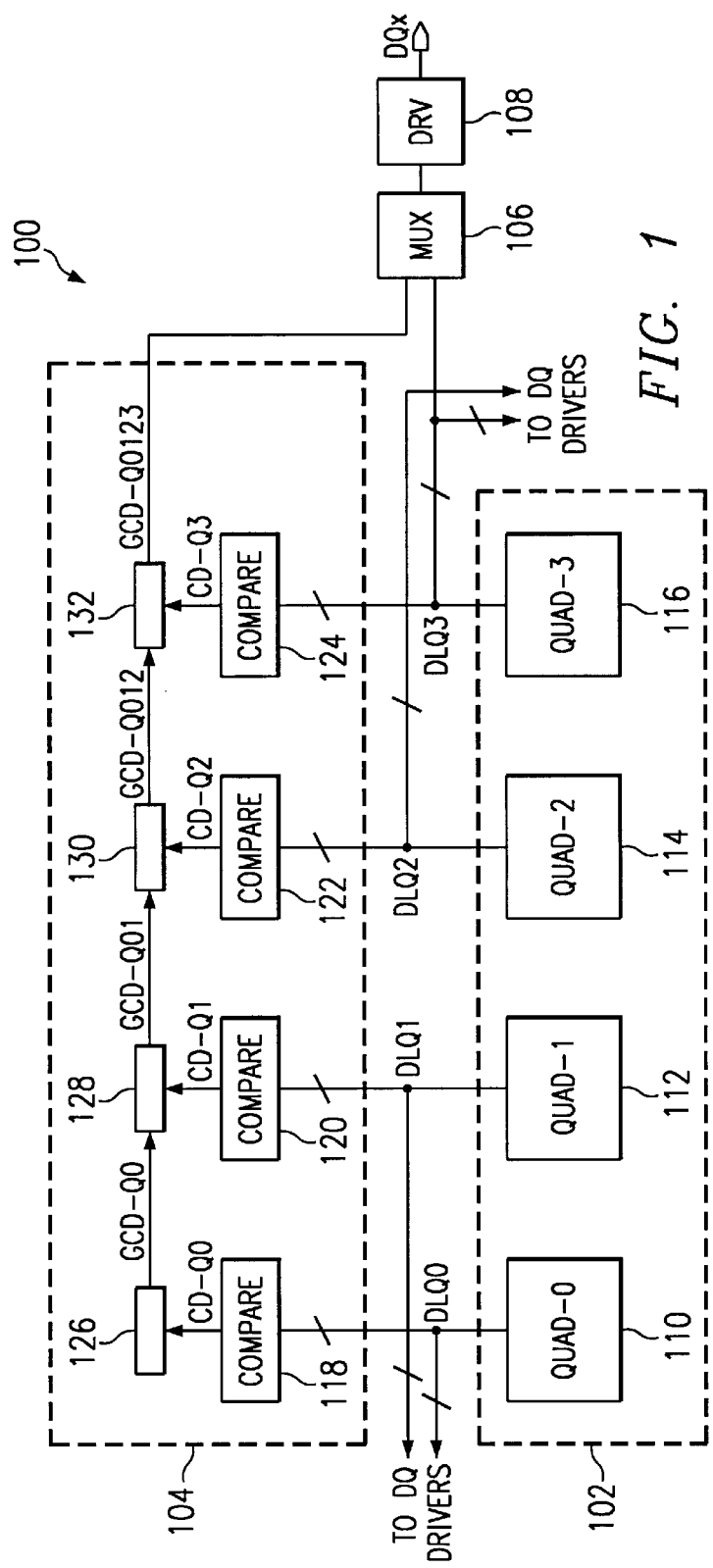

PARALLEL DATA TEST FOR A SEMICONDUCTOR MEMORY

TECHNICAL FIELD

The present invention relates generally to semiconductor devices, and more particularly to data compression and/or parallel data testing of the memory cells in a semiconductor memory device.

BACKGROUND OF THE INVENTION

Semiconductor memory devices typically include a large number of memory cells, each of which can store one or more bits of data. The memory cells are arranged in an array, having a number of rows and columns. Memory cells within the same row are commonly coupled to a word line, and memory cells within the same column are commonly coupled to a bit line. The memory cells within an array are accessed according to the various memory device operations. Such operations include read operations (common to nearly all memory devices), write operations (common to volatile memory devices), and program and erase operations (common to many nonvolatile memory devices). To access memory cells, an external memory address is applied, which activates a word line. When activated, row decoder circuits couple the data stored within the memory cells to the bit lines of the array. The memory address also activates column decoder circuits, which connect a given group of bit lines to input/output circuits and/or program/erase circuits.

There are instances in which the user or manufacturer may wish to perform a high speed test of the data stored in the memory cells of the semiconductor memory device. For example, in the course of fabricating a semiconductor memory device, manufacturing defects can give rise to nonfunctional memory cells within an array. In order to quickly test the functionality of the memory cells, many semiconductor memories may have a feature known as parallel testing. In a normal read or write operation, the input/output (DQ) pins will carry data representative of a single particular addressed memory cell in the semiconductor memory device. However, in a parallel test write operation, a single write operation may simultaneously write the data applied to a single DQ pin into a large number of memory cells. Conversely, in a parallel test read operation, a single read operation may compare data from a large number of memory cells and if the data is all of the same logic level, a "match" logic level will be applied to the DQ pin. If any of the number of memory cells has a data level different than the other memory cells being compared then a "mis-match" logic level will be applied to the DQ pin.

The ability to test multiple memory cells in one read operation enables the manufacturer or user to reduce test time. Reducing test time saves money because the test throughput will be increased and a piece of test equipment will be able to test more memory devices in the same amount of time. This allows the manufacture to purchase fewer pieces of test equipment.

A user may wish to use the parallel test capabilities to test the semiconductor memory device in his unique system environment. For example, the system environment may have an impact on the "soft" errors that occur in a memory device as every system may operate at a unique temperature, voltage, signal noise conditions, or even exposure to alpha particles or gamma rays. The user may use parallel test write cycles to write all logic ones into all of the semiconductor memory cells, then do a "pause" by not executing any cycles over a period of time known as the "pause" time. Then the user will perform the parallel test read cycles to determine if any "soft" errors have been induced in the semiconductor memory device by the system environment. The user takes advantage of the parallel testing capabilities to reduce the total test time required, thus, increasing test throughput.

Dynamic Random Access Memories (DRAMs) generally come in non-synchronous (DRAM) and synchronous (SDRAM) types. A non-synchronous DRAM will perform read and write cycles based on a Row Address Strobe (RAS) signal, Column Address Strobe (CAS) signal, and Write (W) signal. A SDRAM has an added Clock (CLK) signal that operates synchronously with the system and allows much faster data throughput than a non-synchronous DRAM. The faster data throughput (decreased read/write cycle time) means that data compression or comparison must be performed at faster speeds during the parallel test cycles in order to keep the same tight timing requirements in the test mode as is used in normal modes of operation.

Chip (die) size is an important aspect of the semiconductor memory business. The smaller the chip, the more chips per silicon wafer can be manufactured. This decreases total cost per chip because the processing cost of each wafer is constant regardless of the number of chips contained on the wafer. Today, many semiconductor memory devices are of a wide word type. For example, there may be 16, 32, 64 or even more output pins (DQs) per chip. On the chip itself, the portion of the semiconductor memory array that corresponds to each DQ will be located as close as possible to the DQ bond pad. This allows the data lines that transport data from the bond pad to the array portion to be as short as possible. This improves speed due to lower capacitive and resistive effects and decreases chip size because there are not a large number of data lines running the length of the memory chip, thus taking up valuable space. However, in order to perform parallel test operations, a large number of data bits must be brought to the compare circuitry and the results of the comparison must be placed on a desired output pin (DQ). One method of bringing the large number of data bits together to be compared and/or compressed is to route the data lines on the chip to the location in which the compression/comparison circuit is located. This will take up valuable signal routing channels that are typically needed to route address and control signals to critical timing circuits. Additionally, this has the adverse effect of increasing data line resistance and capacitance and increasing the chip size because each data line will take up more area.

It would be desirable to provide data compression/comparison on a semiconductor memory device while occupying few signal routing channels and thus have less of an effect on chip size. It is also desirable to provide a method of data compression/comparison on the semiconductor memory device that can operate at high speeds, as may be needed in a synchronous memory as for example a SDRAM.

SUMMARY OF THE INVENTION

According to the present invention, a semiconductor memory device includes a parallel data test scheme. The semiconductor memory includes an array that is partitioned into array portions with each array portion further divided into sub-arrays and banks. Each array portion provides data bits to a data compression circuit. The data compression circuit includes data compare sections and ripple sections. The data compare sections include data compare circuits that compare the data bits provided by each array portion and provide a compare output to the ripple sections. The compare output has a true logic level, a false logic level, and an error logic level. The ripple sections are coupled together in series and provide a global data compare output. The ripple sections include ripple circuits that receive the compare output and ripple outputs. The ripple outputs have a true logic level, a false logic level, and an error logic level. A multiplexer selects between a data bit and a global data compare output, that is provided from the last of the chain of ripple circuits coupled together in series, to provide either a data output or a data a comparison output to an output pin.

According to one aspect of the invention, the compare circuit has a true compare portion and a false compare portion providing a true output and a false output having the same logic level if the data compare does not produce an error.

According to another aspect of the invention, the ripple outputs are carried by conductors hat have a length substantially smaller than the length of the semiconductor memory die.

BRIEF DESCRIPTION OF THE DRAWINGS

FIG. 1 is a block diagram illustrating a semiconductor memory with a parallel data test according to a preferred embodiment.

DETAILED DESCRIPTION OF THE EMBODIMENTS

Figure 2A:
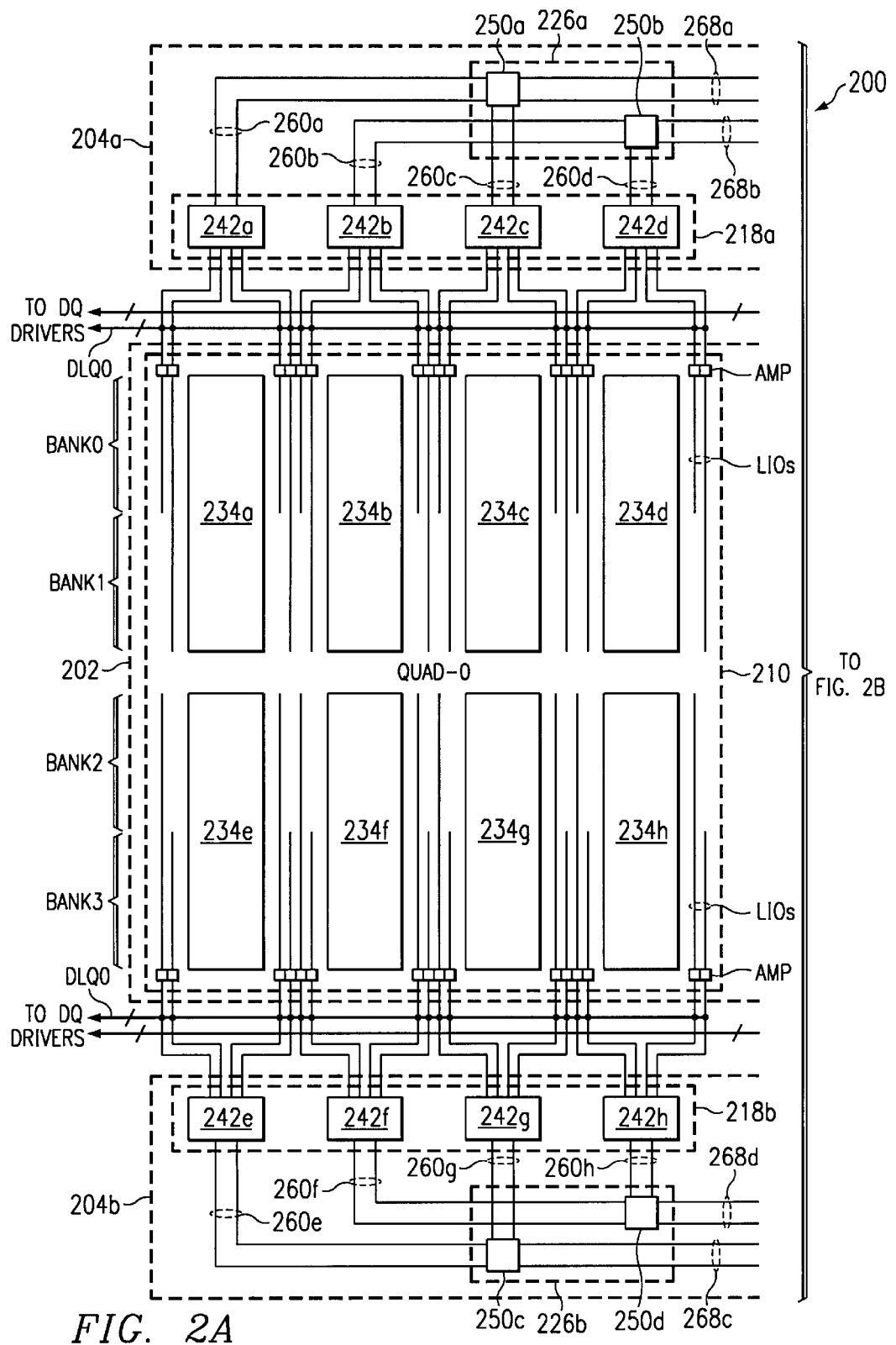
FIGS. 2A and 2B set forth a block schematic diagram of a semiconductor memory with a parallel data test according to a preferred embodiment.

The preferred embodiment is a semiconductor memory device with a novel data compare and compression scheme that allows multiple memory bits to be tested in parallel in a single memory operation cycle. The memory device provides high-speed data compressing/comparison while using a minimum number of signal routing channels, thus reducing adverse chip size effects. The semiconductor memory device of the preferred embodiment is illustrated in a block schematic diagram in FIG. 1 and is designated by the general reference character 100.

The semiconductor memory 100 in FIG. 1 comprises a memory array 102, a data compression circuit 104, a multiplexer 106, and a driver 108. The memory array 102 is divided into four separate array sections ("quadrants") (110–116) and are labeled as Quad-0, Quad-1, Quad-2, and Quad-3. Each quadrant (110–116) provides a data line bus (DLQ0–3) to the data compression circuit 104. The data line buses (DLQ0–3) also provide data to the output pads with DLQ0 and DLQ1 providing data from Quad-0 110 and Quad-1 112 to a set of output pads (not shown) on the left side of the semiconductor memory 100. Data line buses DLQ2 and DLQ3 provide data from Quad-2 114 and Quad-3 116 to a set of output pads (only DQx is shown) on the right side of the semiconductor memory 100.

The data compression circuit 104 comprises four compare circuits 118–124, and four ripple circuits 126–132. Compare circuit 118 receives data from array section 110 by way of data bus DLQ0 and provides a compare data output shown as CD-Q0 which stands for compare data of Quad-0 110. Likewise, compare circuits 120–124 receive data from their respective array sections 112–116 and provide compare data outputs shown as CD-Q1, CD-Q2, and CD-Q3. Ripple circuit 126 receives the compare data CD-Q0 and provides global compare data GCD-Q0. Ripple circuit 128 receives compare data CD-Q1 and global compare data GCD-Q0 and provides global compare data GCD-Q01. Ripple circuit 130 receives compare data CD-Q2 and global compare data GCD-Q01 and provides global compare data GCDQ012. Ripple circuit 132 receives compare data CD-Q3 and global compare data GCD-Q012 and provides global compare data GCD-Q0123.

The multiplexer 106 receives the global compare data GCD-Q0123 and a data line from the data bus DLQ3 and provides an output to the driver 108. Based on the output from the multiplexer 106, the driver 108 applies a logic level to the output pin DQx. The multiplexer 106 passes the data from the data line provided by the data bus DLQ3 to the driver 108 if the semiconductor memory 100 is operating in a normal read mode. However, if the semiconductor memory 100 is operating in the parallel data test mode, the multiplexer 106 passes the global compare data GCD-Q0123 to the driver 108.

The semiconductor memory 100 receives external control signals as well as external address signals. The external control signals and external address signals are not shown in order not to clutter up the drawing. The parallel data test mode is entered upon the reception of a predetermined sequence of control and address signals. In some instances it may even be desired to provide an over-voltage detector to an address or control input buffer in order to detect a higher than supply voltage being applied, which could signal the entrance of the parallel data test mode. This would eliminate using a sequence of control and address signals as a test mode, thus providing the flexibility of having more "normal" modes of operation.

In a "normal" mode of operation, DQx is driven by data corresponding to a predetermined address received by the semiconductor memory 100. The data compression circuit 104 has no effect on the operation of the semiconductor memory 100 when operating in the "normal" mode of operation. However, in the parallel data test mode of operation, the data compression circuit 104 determines the data to be applied to the output pin DQx. The data compression circuit 104 performs a comparison of all the bits received from the array 102 and provides either the data logic level or an error logic level to the output pin DQx. The compare circuit 118 compares the data received from array section 110 and if the data is all of the same logic level, then a true or a false logic level will be applied to the ripple circuit 126. A true logic level will be applied if all the data received from array section 110 are a logic one, and a false logic level will be applied to the compare circuit 118 if all the data received from array section 110 are a logic zero. If the data received from array section 110 is not all at the same logic level then the compare circuit 118 provides an error logic level to the ripple circuit 126. The ripple circuit 126 then provides global compare data GCD-Q0 having either a true logic level, false logic level, or error logic level in accordance with the logic level of the output of the compare circuit 118.

The compare circuits 120–124 operate in the same manner as the compare circuit 118. The compare circuits 120–124 receive data from array sections 112–116. The compare circuit 120 provides a compare output CD-Q1 to the ripple circuit 128. The ripple circuit 128 receives the global compare data GCD-Q0 from the ripple circuit 126 and the compare output CD-Q1 from the compare circuit 120 and provides a global compare data output GCD-Q01.

If both the global compare data GCD-Q0 and the compare output CD-Q1 are at the true logic level, the ripple circuit 128 provides a true logic level to the global compare data output GCD-Q01. If both the global compare data GCD-Q0 and the compare output CD-Q1 are at the false logic level, the ripple circuit 128 provides a false logic level to the global compare data output GCD-Q01. If the global compare data GCD-Q0 and the compare output CD-Q1 are at different logic levels, the ripple circuit 128 provides an error logic level to the global compare data output GCD-Q01. If the global compare data GCD-Q0 or the compare output CD-Q1 are at the error logic level, the ripple circuit 128 provides an error logic level to the global compare data output GCD-Q01.

The ripple circuits 130 and 132 operate in the same manner as the ripple circuit 128, except the ripple circuits 130 and 132 receive compare output from their respective compare circuits 122 and 124. The data compression circuit 104 provides the global compare data output GCD-Q0123 which carries true, false, or error information from all of the compare circuits 118–124. Thus, it can be seen that an error in the data comparison from the compare circuit 118 associated with array section 110 will "ripple" through the ripple circuits 126–132 to produce an error logic level at the global compare data GCD-Q0123. Likewise, any error in the data comparison from any of the other compare circuits 118 will "ripple" through the ripple circuits to produce an error logic level at the global compare data GCD-Q0123. The multiplexer 106 then applies the global compare data GCD-Q0123 to the driver 108 which drives the output pin DQx to a logic level indicating either a pass-true, pass-false, or fail. As just one example, the pass-true logic level may be a logic high, the pass-false logic level may be a logic low, and the fail logic level may be a high impedance state.

It can be seen from FIG. 1 that the global compare data lines GCD-Q0–GCD-Q0123 each have a length that is much less than the length of the chip. This reduces the resistance and capacitance of each line, which reduces signal transition times. Also, the global compare data lines do not "overlap." In other words there are no areas in which two of the global compare data lines run parallel to each other. This minimizes the number of routing channels needed to implement the parallel data test scheme, thus saving chip area.

Figure 2B:
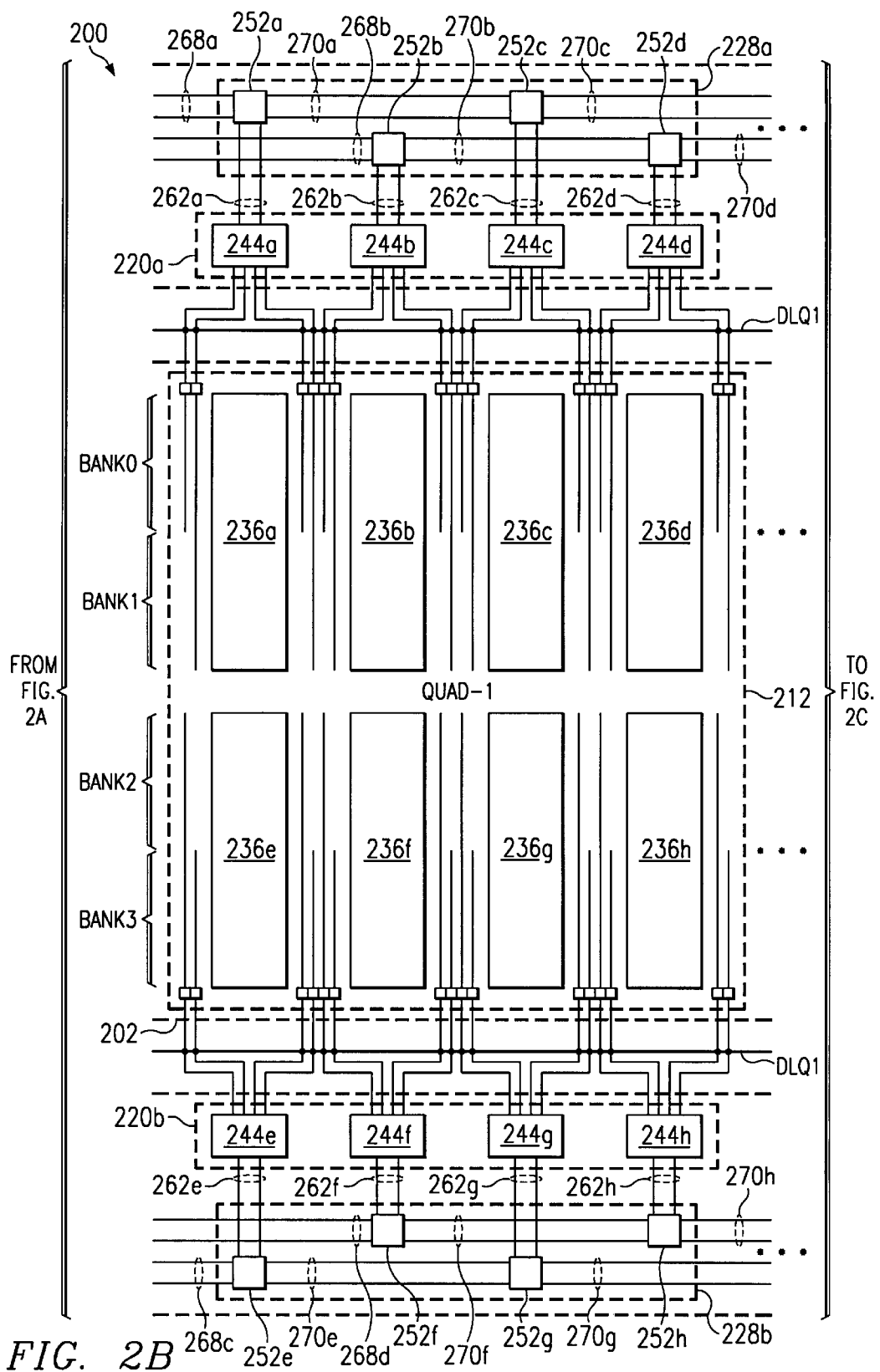
Figure 2C:
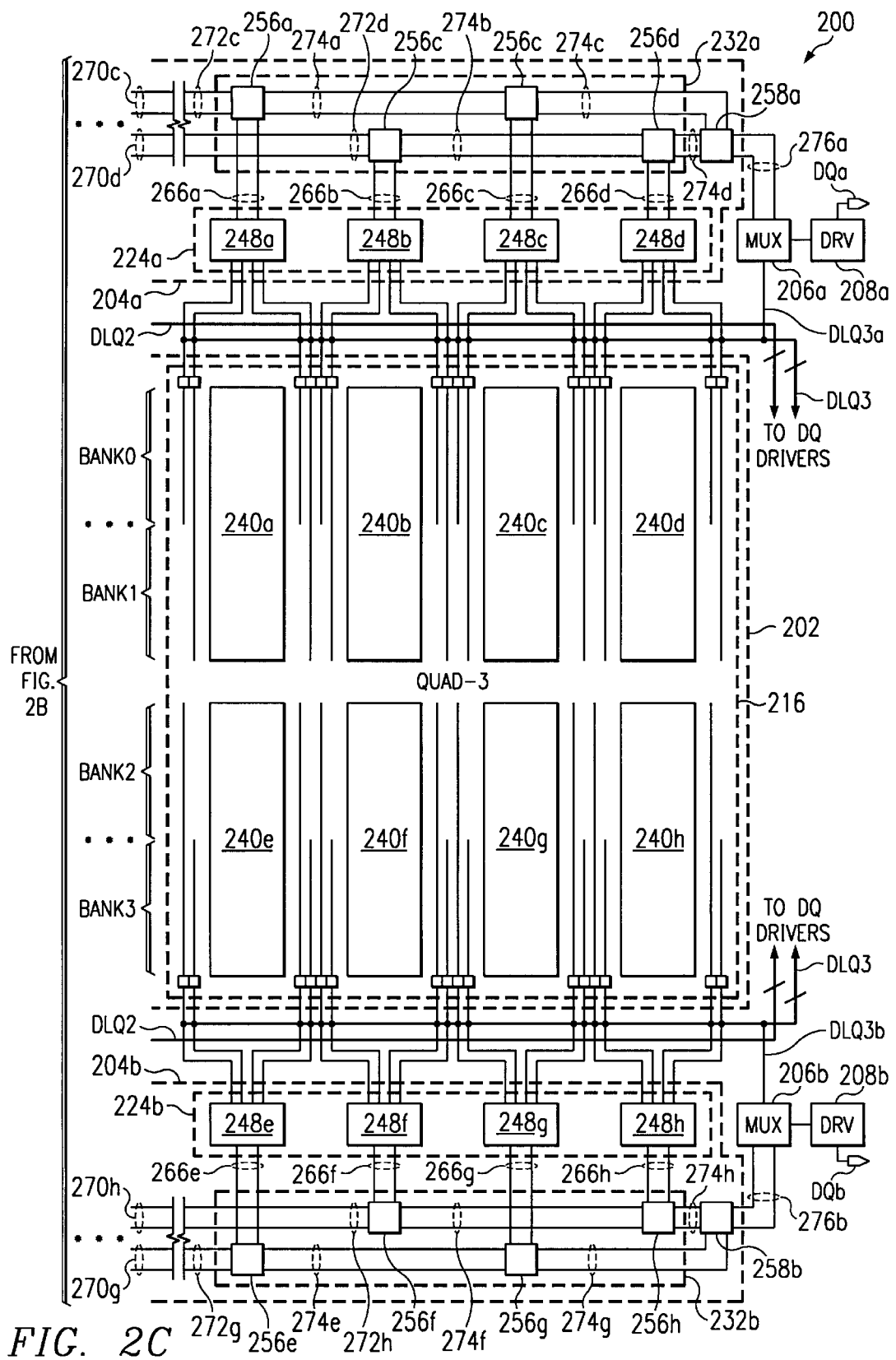

Referring now to FIG. 2A and FIG. 2B, the semiconductor memory is set forth in a block schematic diagram illustrating the general architecture of the device and is designated by the general reference character 200. Certain elements from FIG. 2A and FIG. 2B have corresponding elements as illustrated in FIG. 1. Such corresponding elements are given the same general reference character as in FIG. 1, except the first number is a "2" instead of a "1". FIG. 2A illustrates the general architecture of the array sections 110 and 112 of FIG. 1 as well as the compare circuits 118 and 120 and ripple circuits 126 and 128 of FIG. 1. FIG. 2B illustrates the general architecture of the array section 116 of FIG. 1 as well as the compare circuit 124 and ripple circuit 132 of FIG. 1. The array section 114, compare circuit 122, and ripple circuit 130 of FIG. 1 is not illustrated in FIG. 2A or FIG. 2B as they are generally identical to the array sections 112 and 116, compare circuit 120 and 124, and ripple circuits 128 and 132 of FIG. 1.

The semiconductor memory of FIG. 2A and FIG. 2B comprises a memory array 202, a first data compression circuit 204a, a second data compression circuit 204b, a first multiplexer 206a, a second multiplexer 206b, a first driver 208a, and a second driver 208b. Referring now to FIG. 2A, the memory array 202 comprises array portions 210 and 212 (the memory array 202 further comprises an array portion not shown) and an array portion 216 in FIG. 2B. The array portion 210 (also labeled as Quad-0), has eight sub-array portions 234a–234h. Each sub-array portion 234a–234h has two local input/output lines (LIOs) on each side. The LIOs may each comprise complementary pairs, but to simplify the drawing, each LIO is only drawn as a single line. Each LIO is coupled to an amplifier (AMP). Only the end amplifiers (AMP) are labeled in order to prevent excess cluttering up of the figure. Thus, there are two amplifiers (AMP) on each side of each sub-array portion 234a–234h. The array portion 210 is further divided into four banks (BANK0–3). Each sub-array portion 234a–234h contains portions of two banks. For example, each sub-array portion 234a–234d can be divided into two halves along the x-axis with the top half belonging to BANK0 and the bottom half belonging to BANK1. Likewise, each sub-array portion 234e–234h can be divided into two halves along the x-axis with the top half belonging to BANK2 and the bottom half belonging to BANK3. Of the two LIOs on each side of the sub-array portions 234a–234h, one of the two LIOs carry data to and from one of the banks and the other of the two LIOs carry data to and from the other bank. For example, the leftmost of the two LIOs on the left side of the sub-array portion 234a carries data to and from the BANK0 Half and the rightmost of the two LIOs on the left side of the sub-array portion 234a carries data to and from the BANK1 half of the sub-array portion 234a. Likewise, the leftmost of the two LIOs on the left side of the sub-array potion 234e carries data to and from the BANK2 half and the rightmost of the two LIOs on the left side of the sub-array portion 234e carries data to and from the BANK3 half.

The amplifiers (AMP) drive the data from the LIOs to the data line bus DLQ0. The data line bus DLQ0 transports the data to data output driver circuits (not shown). The data line bus DLQ0 also carries the data to the first and second data compression circuits 204a and 204b. The first data compression circuit 204a receives up to 16 bits of data from the BANK0 and/or BANK1 portion of array portion 210. The second data compression circuit 204b receives up to 16 bits of data from the BANK2 and/or BANK3 portion of array portion 210.

The first data compression circuit 204a comprises a data compare circuit section 218a and a ripple circuit section 226a. The data compare circuit section 218a comprises four data compare circuits 242a–242d. Each data compare circuit 242a–242d receives data from its corresponding sub-array section 234a–234d. The data compare circuits 242a–242d compare the data received. If the received data all has the same logic level, then the data compare circuits 242a–242d will either produce a TRUE output or a FALSE output on compare data output lines 260a–260d, depending on the logic level received. However, if the data does not "match" and all the data is not of the same logic level, then the data compare circuits 242a–242d will produce an ERROR output on compare data output lines 260a–260d.

The ripple circuit section 226a of the first data compression circuit 204a comprises two ripple circuits 250a and 250b. Ripple circuit 250a receives compare data output lines 260a and 260c and produces a ripple output 268a. The ripple output 268a will be at a TRUE logic level if both compare data output lines 260a and 260c are at the TRUE logic level and will be at a FALSE logic level if both compare data output lines 260a and 260c are at the FALSE logic level. The ripple output 268a will be at an ERROR logic level if either of the compare data output lines 260a and 260c is at the ERROR logic level. The ripple circuit 250b receives compare data output lines 260c and 260d and produces a ripple output 268b. The ripple circuit 250b operates in the same manner as the ripple circuit 250a.

The second data compression circuit 204b also comprises a data compare circuit section 218b and a ripple circuit section 226b. The data compare circuit section 218b comprises data compare circuits 242e–242h which operate in the same manner as the data compare circuits 242a–242d in the data compare circuit section 218a. The data compare circuits 242e–242h receive data from their corresponding sub-array sections 234e–234h and provide compare data output lines 260e–260h with either a TRUE logic level, FALSE logic level, or ERROR logic level in the same manner as the data compare circuits 242a–242d. The ripple circuit section 226b comprises two ripple sections 250c and 250d. The ripple circuit 250c receives data compare output lines 260e and 260g and produces a ripple output 268c. The ripple circuit 250d receives data compare output lines 260f and 260h and produces a ripple output 268d. The ripple circuits 250c and 250d operate in the same manner as ripple circuits 250a and 250b.

The memory array 202 of the semiconductor memory 200 in FIG. 2A and FIG. 2B further comprises an array portion 212 that provides data to data line bus DLQ1 via its LIOs and amplifiers (AMP) in the same manner that array portion 210 provides data to the data line bus DLQ0. The array portion 212 is divided into sub-array sections 236a–236h, which are divided into four banks BANK0–3 in the same manner as array portion 210. The first data compression circuit 204a further comprises a compare circuit section 220a that operates in the same manner as compare circuit section 218a, except the compare circuit section 220a receives up to sixteen data bits from the array portion 212.

The first data compression circuit 204a further comprises a ripple circuit section 228a that receives the compare data output 262a–262d as inputs and also receives the ripple outputs 268a and 268b as inputs. The ripple circuit section 228a comprises four ripple circuits 252a 252d. The ripple circuit 252a receives the ripple output 268a and the compare data output $26^2$a and produces a ripple output 270a. The ripple circuit 252b receives the ripple output 268b and the compare data output 262b and produces a ripple output 270b. The ripple circuit 252c receives the ripple output 270a and the compare data output 262c and produces a ripple output 270c. The ripple circuit 252d receives the ripple output 270b and the compare data output 262d and produces a ripple output 270d. The ripple circuits 252a–252d operate in the same manner as the ripple circuits 250a–250d, producing a ripple output having a TRUE logic level if its inputs are at the TRUE logic level. A FALSE logic level if its inputs are at the FALSE logic level, and an ERROR logic level either of its inputs are at the ERROR logic level.

The first data compression circuit 204b further comprises a compare circuit section 220b that operates in the same manner as compare circuit section 218b, except the compare circuit section 220b receives up to sixteen data bits from the array portion 212. The second data compression circuit 204b also comprises a ripple circuit section 228b that receives the compare data output 262e–262h as inputs and also receives the ripple outputs 268c and 268d as inputs. The ripple circuit section 228b comprises four ripple circuits 252e–252h. The ripple circuit 252e receives the ripple output 268c and the compare data output 262e and produces a ripple output 270e. The ripple circuit 252f receives the ripple output 268d and the compare data output 262f and produces a ripple output 270f. The ripple circuit 252g receives the ripple output 270e and the compare data output 262g and produces a ripple output 270g. The ripple circuit 252h receives the ripple output 270f and the compare data output 262h and produces a ripple output 270h. The ripple circuits 252e–252h operate in the same manner as the ripple circuits 250a–250d, producing a ripple output having a TRUE logic level if its inputs are at the TRUE logic level. A FALSE logic level it its inputs are at the FALSE logic level, and an ERROR logic level either of its inputs are at the ERROR logic level.

The semiconductor memory 200 of FIG. 2A and FIG. 2B has a memory array 202 that has four array portions 210–216. In order to simplify the drawing only three of the array portions 210, 212, and 216 are shown along with the corresponding circuitry in the first and second data compression circuits 204a and 204b. Array portion 216 shown in FIG. 2B contains eight sub-array portions 240a–240h and is generally identical to the array portions 210 and 212 described earlier. The array portion 216 is divided into sub-array sections 240a–240h, which are divided into four banks BANK0–3 in the same manner as array portions 210 and 212. The first data compression circuit 204a further comprises a compare circuit section 224a that operates in the same manner as compare circuit sections 218a and 220a, except the compare circuit section 224a receives up to sixteen data bits from the array portion 216.

The first data compression circuit 204a further comprises a ripple circuit section 232a that receives the compare data output 266a–266d as inputs and also receives the ripple outputs 272c and 272d as inputs. The ripple circuit section 232a comprises four ripple circuits 256a–256d. The ripple circuit 256a receives the ripple output 272c and the compare data output 266a and produces a ripple output 274a. The ripple circuit 256b receives the ripple output 272d and the compare data output 266b and produces a ripple output 274b. The ripple circuit 256c receives the ripple output 274a and the compare data output 266c and produces a ripple output 274c. The ripple circuit 256d receives the ripple output 274b and the compare data output 266d and produces a ripple output 274d. The ripple circuits 256a–256d operate in the same manner as the ripple circuits 250a–250d and 252a–252h, producing a ripple output having a TRUE logic level if its inputs are at the TRUE logic level, a FALSE logic level it its inputs are at the FALSE logic level, and an ERROR logic level if either of its inputs are at the ERROR logic level.

The second data compression circuit 204b further comprises a compare circuit section 224b that operates in the same manner as compare circuit sections 218b and 220b, except the compare circuit section 224b receives up to sixteen data bits from the array portion 216. The second data compression circuit 204b also comprises a ripple circuit section 232b that receives the compare data output 266e–266h as inputs and also receives the ripple outputs 272g and 272h as inputs. The ripple circuit section 232b comprises four ripple circuits 256e–256h. The ripple circuit 256e receives the ripple output 272g and the compare data output 266e and produces a ripple output 274e. The ripple circuit 256f receives the ripple output 272h and the compare data output 266f and produces a ripple output 274f. The ripple circuit 256g receives the ripple output 274e and the compare data output 266g and produces a ripple output 274g. The ripple circuit 256h receives the ripple output 274f and the compare data output 266h and produces a ripple output 274h. The ripple circuits 256e–256h operate in the same manner as the ripple circuits 250a–250d and 252a–252h, producing a ripple output having a TRUE logic level if its inputs are at the TRUE logic level, a FALSE logic level if its inputs are at the FALSE logic level, and an ERROR logic level if either of its inputs are at the ERROR logic level.

The first and second data compression circuits 204a and 204b further comprise a ripple circuit 258a and 258b respectively. The ripple circuit 258a receives the ripple outputs 274c and 274d and provides a global data compare output 276a. The ripple circuit 258b receives the ripple outputs 274g and 274h and provides a global data compare output 276b. The global data compare outputs 276a and 276b are provided to first and second multiplexer 206a and 206b, respectively. The multiplexers 206a and 206b pass either the global data compare output 276a and 276b or the data line output (DLQ3a and DLQ3b) to the output driver 208a and 208b, depending on whether the semiconductor memory is in the parallel test mode or a normal operating mode. If the semiconductor memory 200 is in the parallel test mode, the outputs DQa and DQb will have parallel test data that signifies whether the bits tested were all at a TRUE logic level, FALSE logic level, or there were some bits that were not at the same logic level as the others. Under the condition in which some bits tested are not at the same logic level as the others, the output DQa or DQb will be at the ERROR logic level. Examples of a TRUE logic level, FALSE logic level, and ERROR logic level may be a logic one, logic zero, and high impedance state respectively.

A space saving aspect and a speed improving aspect of the invention can be explained further with reference to FIG. 2A and FIG. 2B. It can be seen that only eight routing channels (ripple outputs 268a–d, 270a–h, and 274a–h on top and bottom) are used for the parallel test circuitry running from left to right along the semiconductor memory 200. If the ripple circuits 250a–d, 252a–h, and 256a–h were not used in the parallel test implementation, the data compare outputs (260a–h, 262a–h, 266a–h, as well as compare outputs not shown for array portion Quad-2) could occupy up to 64 routing channels. This would greatly increase the die size and adversely effect production costs. It is also noted that the ripple outputs 268a–d, 270a–h, and 274a–h are only routed for a relatively small distance (less than ⅛ of the chip length), this greatly reduces the parasitic resistance and capacitance effects of the conductor, which increases speed. Also, due to the small distance, the ripple outputs outputs 268a–d, 270a–h, and 274a–h may be routed in a "lower" conductive layer, such as a metal 1 layer in a 2-metal process. This would further decrease die size because the use of a "lower" conductive layer can be routed below (z-direction) the normal routing channel and will not cause the die dimensions to be pushed out.

The semiconductor memory 200 in FIG. 2A and FIG. 2B can test up to 128 bits in parallel with 64 bits coming from BANK0 and BANK1, and 64 bits coming from BANK2 and BANK3. Although 128 bits may be tested in parallel, the compare circuits 248a–248h, 250a–250h, and 254a–254h may receive control signals and address signals that will allow only a portion of the available bits to be tested. This may allow for example, 16-bit, 32-bit, 64-bit or 128-bit data comparisons in the parallel test mode.

Figure 3:
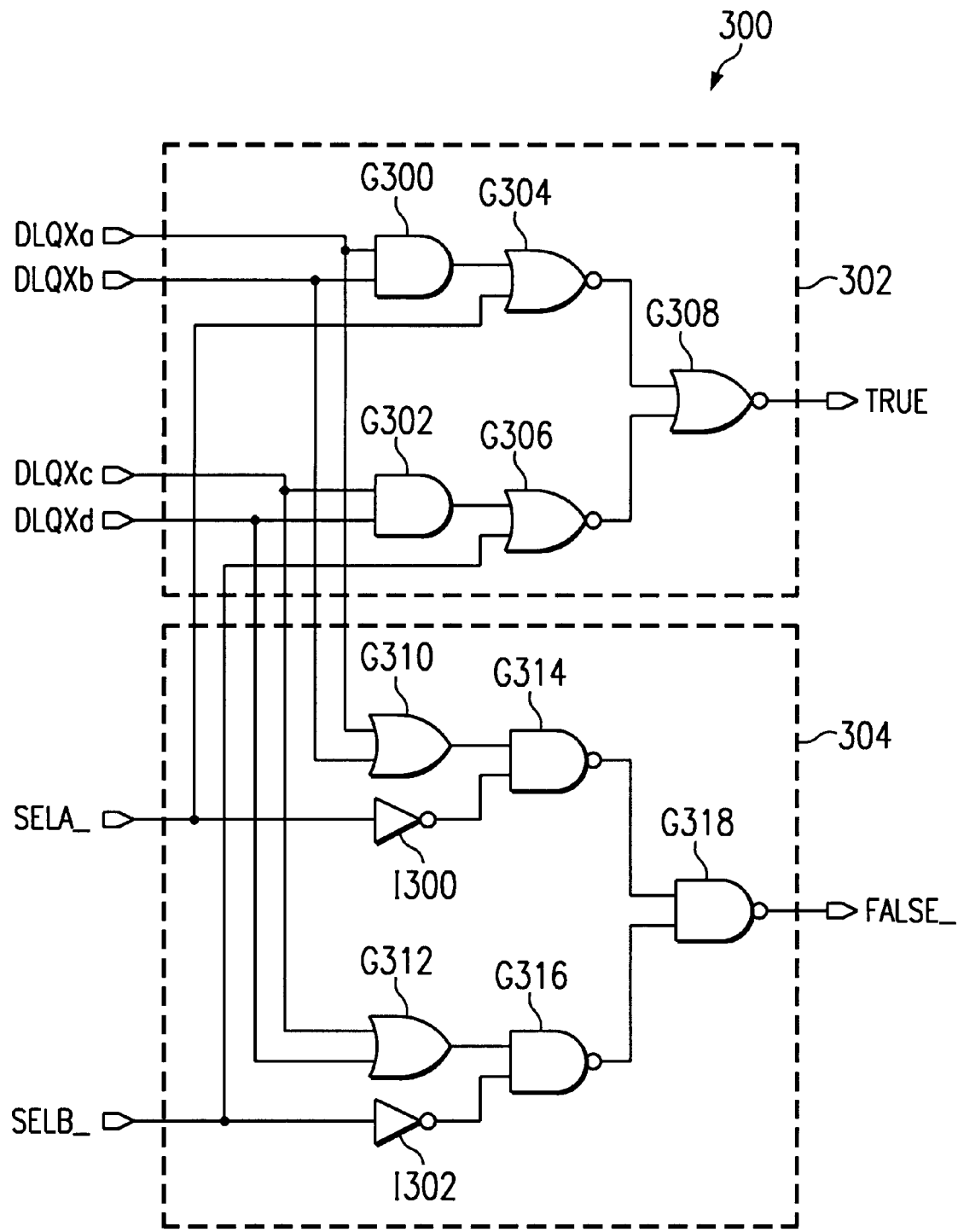
FIG. 3 is a logic schematic diagram of a data compare circuit.

Referring now to FIG. 3, a logic schematic diagram of a compare circuit is set forth and is designated by the general reference character 300. The compare circuit 300 comprises a true compare 302 and a false compare 304. The true compare 302 receives the data lines (DLQXa–DLQXd, and two signals SELA_, and SELB_ as inputs and produces a true compare output TRUE. The true compare 302 comprises two two-input AND gates (G300 and G302) and three two-input NOR gates (G304, G306, and G308). The two-input AND gate G300 receives data lines DLQXa and DLQXb as inputs and produces an output. The two-input NOR G304 receives the output of gate G300 and SELA as inputs and produces an output. The two-input AND gate G302 receives data lines DLQXc and DLQXd as inputs and produces an output. The two-input NOR G306 receives the output of gate G302 and SELB_ as inputs and produces an output. The two-input NOR G308 receives the outputs of G304 and G306 as inputs and produces the true compare output TRUE.

The true compare 302 has two data line compare paths. The first path is for comparing DLQXa with DLQXb and the second path is for comparing DLQXC with DLQXd. The first path is enabled by the SELA_ signal being at a logic low level. The second path is enabled by the SELB_ being at a logic low level.

The false compare 304 receives the data lines (DLQXa–DLQXd, and the SELA_, and SELB_ signals as inputs and produces a false compare output FALSE. The false compare 304 comprises two inverters (I300 and I302), two two-input OR gates (G310 and G312) and three two-input NAND gates (G314, G316, and G318). The two-input OR gate G310 receives data lines DLQXa and DLQXb as inputs and produces an output. The inverter 1300 receives SELA_and produces an output. The two-input NAND G314 receives the output of gate G310 and SELA, by way of inverter 1300, as inputs and produces an output. The two-input OR gate G312 receives data lines DLQXc and DLQXd as inputs and produces an output. The inverter I302 receives SELB_ and produces an output. The two-input NAND G316 receives the output of gate G312 and SELB_, by way of inverter 1302, as inputs and produces an output. The two-input NAND G318 receives the outputs of G314 and G316 as inputs and produces the false compare output FALSE_.

The false compare 304 has two data line compare paths. The first path is for comparing DLQXa with DLQXb and the second path is for comparing DLQXc with DLQXd. The first path is enabled by the SELA_ signal being at a logic low level. The second path is enabled by the SELB_ being at a logic low level.

During a data comparison, the true compare output TRUE will be at a logic high level if all of the data being compared is at a logic high level (i.e. the data is a "1"). The true compare output TRUE will be at a logic low level if any of the data being compared is at a logic low level (i.e. any of the data is a "0"). The false compare output FALSE_ will be at a logic low level if all of the data being compared is at a logic low level (i.e. the data is a "0")."). The false compare output FALSE_ will be at a logic high level if any of the data being compared is at a logic high level (i.e. any of the data is a "1"). Thus, if there is no error, the true compare output TRUE and false compare output FALSE_ should be at the same logic level. If the data being compared is all at a logic low level, then the false compare output FALSE_ should be at a logic low level (indicating that the data is false or "0") and the true compare output should be at a logic low level (indicating that the data is not true or "1"). However, if the data being compared is all at a logic high level, then the false compare output FALSE_ should be at a logic high level (indicating that the data is not false or "0") and the true compare output should be at a logic high level (indicating that the data is true or "1"). If there is an error (i.e. any of the data being compared is at a different logic level than the other data), then the true compare output TRUE will be at a logic low level and the false compare output FALSE_ will be at a logic high level.

The compare circuit 300 can be enabled to compare only the data on the data lines DLQXa and DLQXb or enabled to compare only the data on the data lines DLQXc and DLQXd or the data on all four data lines DLQXa–DLQXd. If SELA__ is enabled (at the logic low level) and SELB__ is disabled (at the logic high level) then only DLQXa and DLQXb are compared because NOR gate G304 and NAND gate G314 are enabled, but NOR gate G306 and NAND gate G316 are disabled. If SELA__ is disabled (at the logic high level) and SELB__ is enabled (at the logic low level) then only DLQXc and DLQXd are compared because NOR gate G306 and NAND gate G316 are enabled, but NOR gate G304 and NAND gate G314 are disabled. If both SELA__ and SELB__ are enabled (at the logic low level) then all of the data lines DLQXa–DLQXd are compared because NOR and NAND gates (G304, G306, G314, and G316) are enabled. The SELA__ and SELB__ signals may comprise address and parallel test control signal information. This will allow flexibility in the parallel test configurations that may be implemented by the user.

Figure 4A:
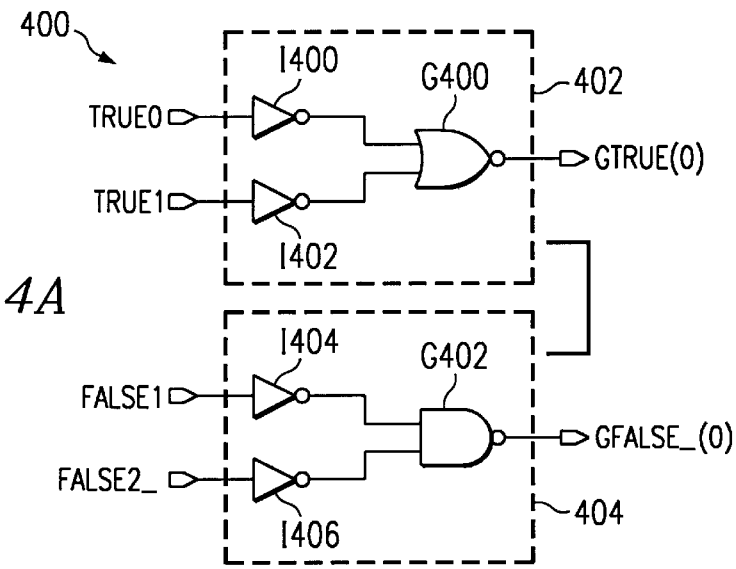
FIGS. 4A, 4B, and 4C are logic schematic diagrams of the ripple circuits according to a preferred embodiment.
Figure 4B:
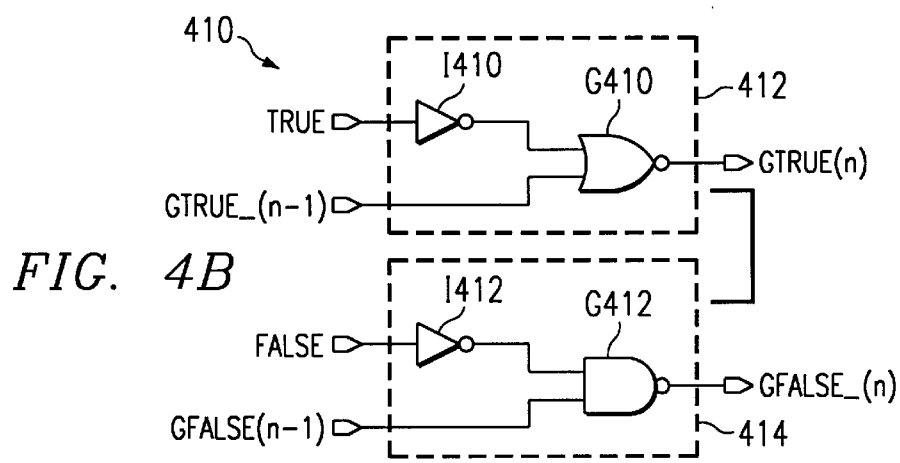
Figure 4C:
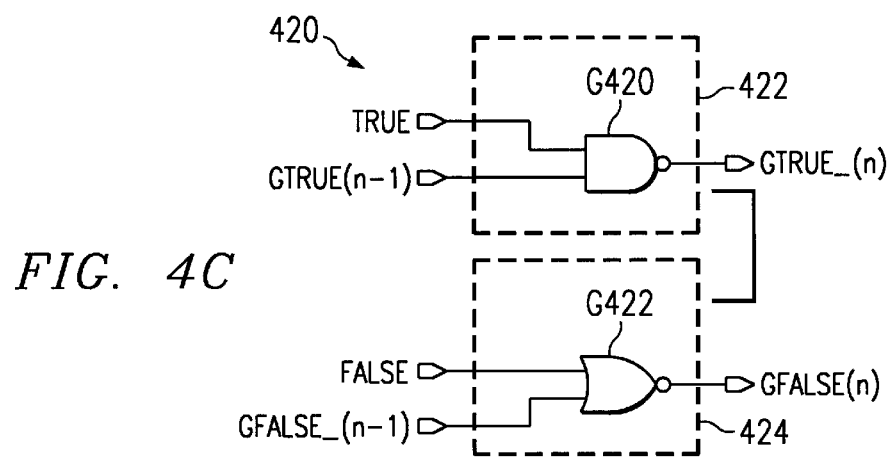

Referring now to FIG. 4A, FIG. 4B, and FIG. 4C, ripple circuits for the preferred embodiment are set forth in logic schematic diagrams and designated with the general reference characters 400, 410 and 420 respectively. The ripple circuit 400 is representative of the ripple circuits 250a and 250b in FIG. 2A. The ripple circuit 410 is representative of the ripple circuits 252c and 252d in FIG. 2A and 256c and 256d in FIG. 2B. The ripple circuit 420 is representative of the ripple circuits 252a and 252b in FIG. 2A and 256a and 256b in FIG. 2B.

The ripple circuit 400 comprises a true ripple circuit 402 and a false ripple circuit 404. The true ripple circuit 402 receives the true compare TRUE0 and the true compare TRUE1 and produces a true ripple output GTRUE(0). The true ripple circuit 402 comprises two inverters (1400 and 1402) and a two-input NOR gate G400. The NOR gate G400 receives true compare TRUE0 by way of inverter 1400 as one input, and receives true compare TRUE1 by way of inverter 1402 as the other input, and generates the true ripple output GTRUE(0) as an output. The false ripple circuit 404 receives the false compare FALSE0__ and the false compare FALSE1__ and produces a false ripple output GFALSE__(0). The false ripple circuit 404 comprises two inverters (1404 and 1406) and a two-input NAND gate G402. The NAND gate G402 receives FALSE0 by way of inverter 1404 as one input, and receives false compare FALSE1__ by way of inverter 1406 as the other input, and generates the false ripple output GFALSE__(0) as an output.

Referring to FIG. 4B, the ripple circuit 410 comprises a true ripple circuit 412 and a false ripple circuit 414. The true ripple circuit 412 receives the true compare TRUE and a true ripple output GTRUE__(n−1) (from a previous ripple circuit) and produces a true ripple output GTRUE(n). The true ripple circuit 412 comprises an inverter 1410 and a two-input NOR gate G410. The NOR gate G410 receives the true compare TRUE by way of inverter 1410 as one input, and receives the true ripple output GTRUE(n−1) (from a previous ripple circuit) as the other input, and generates the true ripple output GTRUE(n) as an output. The false ripple circuit 414 of FIG. 4B receives a false compare FALSE__ and a false ripple output GFALSE(n−1) (from a previous ripple circuit) and produces a false ripple output GFALSE__(n). The false ripple circuit 414 comprises an inverter I412 and a two-input NAND gate G412. The NAND gate G412 receives FALSE__ by way of inverter 1412 as one input, and receives false ripple output GFALSE(n−1) as the other input, and generates the ripple output GFALSE—(n) as an output.

Referring to FIG. 4C, the ripple circuit 420 comprises a true ripple circuit 422 and a false ripple circuit 424. The true ripple circuit 422 receives the true compare TRUE and a true ripple output GTRUE(n−1) and produces a true ripple output GTRUE__(n). The true ripple circuit 422 comprises a two-input NAND gate G420. The NAND gate G420 receives the true compare TRUE as one input and receives the true ripple output GTRUE(n−1) as the other input and generates the true ripple output GTRUE __(n) as an output. The false ripple circuit 424 of FIG. 4C receives a false compare FALSE__ and a false ripple output GFALSE__(n−1) and produces a false ripple output GFALSE(n). The false ripple circuit 424 comprises a two-input NOR gate G422. The NOR gate G422 receives FALSE__ as one input and receives false ripple output GFALSE__(n−1) as the other input and generates the false ripple output GFALSE(n) as an output.

It can be seen that the compare outputs 260a–h, 262a–h, and 264a–h, and ripple outputs 268a–d, 270a–h, and 274a–h of FIG. 2A and 2B have a true logic component and a false logic component. In a pass situation, the true logic component and the false logic component are both at the same logic level. The global compare outputs 276a and 276b of FIG. 2B also have a true logic component and a false logic component. In a pass situation, the true logic component and the false logic component are both at the same logic level. In order to output only a pass or fail signal, the multiplexers 206a and 206b may incorporate an exclusive OR (XOR) or exclusive NOR (XNOR) function. Thus, if both the true logic component and the false logic component of the global compare outputs 276a or 276b are at the same logic level, the XOR/XNOR function will output a pass logic level, but if the global compare outputs 276a or 276b are at opposite logic levels, the XOR/XNOR function will output a fail logic level. The pass or fail logic level will then be output to the output pin DQa or DQb.

Although the preferred embodiment of the data comparison circuits are provided in a Synchronous DRAM, this should not be construed as a limitation. Other memory devices could benefit from the invention, a non-exhaustive list would include standard DRAM, ferroelectric RAM, Static RAM, and Programmable Read Only Memories to name just a few. The invention may be used in an error detection system in which the BANKS and array portions are individual memory chips and the compare circuits compare outputs from the memory chips.

Although the present invention has been described in detail, it should be understood that various changes, substitutions, and alterations could be made without departing from the spirit and scope of the invention as defined by the appended claims.

What is claimed is:

1. A semiconductor memory device having a parallel data test mode, comprising: an array of memory cells arranged in rows and columns, the array of memory cells being divided into a plurality of array portions;
   a plurality of compare circuits, each compare circuit receiving a plurality of data bits from a different said array portion and generating a compare output, the compare output having a pass indication if the plurality of data bits have the same logic level and having a fail indication if the plurality of data bits do not have the same logic level;
   a plurality of ripple circuits, each ripple circuit receiving the compare output from a different one of said compare circuits and generating a ripple output having a pass indication and a fail indication responsive to said compare output; and
   at least one of the plurality of ripple circuits further receiving a ripple output from another of the plurality of ripple circuits, the ripple output of the at least one ripple circuit being in the fail indication if either the received ripple output or the received compare output are in the fail indication.

2. The semiconductor memory device of claim 1, wherein the compare output further comprises a true indication when the plurality of data bits all have one logic level.

3. The semiconductor memory device of claim 2, wherein the ripple output of the at least one ripple circuit further comprises a true indication when the compare output received and the ripple output from another of the plurality of ripple circuits have the true indication.

4. The semiconductor memory device of claim 1, wherein the compare output has the false indication when the plurality of data bits all have a zero logic level.

5. The semiconductor memory device of claim 4, further including the ripple output of the at least one ripple circuit further comprises a false indication when the compare output received and the ripple output from another of the plurality of ripple circuits have the false indication.

6. A semiconductor memory device, comprising am array of memory cells arranged in rows and columns, the array of memory cells being divided into a plurality of array portions;
   a plurality of compare circuits, each compare circuit receiving a plurality of data bits from an array portion and generating a compare output, the compare output indicating the result of a comparison of the plurality of data bits;
   a plurality of ripple circuits coupled together in series, each ripple circuit receiving the compare output from a compare circuit and generating a ripple output; and
   an output driver coupled to receive the ripple output from the last of the ripple circuits arranged in series, the output driver generating a data output.

7. The semiconductor memory device of claim 6, wherein each compare circuit comprises a true compare circuit for comparing the plurality of data bits for a logic one condition.

8. The semiconductor memory device of claim 7, wherein each compare circuit further comprises a false compare circuit for comparing the plurality of data bits for a logic zero condition.

9. The semiconductor memory device of claim 6, wherein each compare circuit receives a select signal for selecting the plurality of data bits to be compared by the compare circuit.

10. The semiconductor memory device of claim 6, wherein the semiconductor memory device has a die length and a die width with the die width being less than the die length; each ripple output is transmitted by a conductor having a conductor length and a conductor width with the conductor width being less than the conductor length; and each conductor length is less than $\frac{1}{4}$ of the die length.

11. The semiconductor memory device of claim 6 wherein each output from a said ripple circuit to a ripple circuit coupled thereto does not run parallel to an output from another ripple circuit of said plurality of ripple circuits to the ripple circuit coupled thereto.

12. The semiconductor memory device of claim 6 wherein said memory device is contained on a single chip and further including data lines coupling said plurality of ripple circuits, the length of each of said data lines being less than the length of the chip.

* * * * *

UNITED STATES PATENT AND TRADEMARK OFFICE
CERTIFICATE OF CORRECTION

PATENT NO. : 6,484,289 B1
DATED : November 19, 2002
INVENTOR(S) : Kuo-yuan Hsu

It is certified that error appears in the above-identified patent and that said Letters Patent is hereby corrected as shown below:

Title page,
Item [63], insert -- Related U.S. Application Data, Provisional application No. 60/102,024, Sept 28, 1998 --.

Column 1,
Line 3, insert -- This application claims priority under 35 USC 119(e)(1) of provisional application number 60/102,024, filed 09/28/98. --

Signed and Sealed this

Seventeenth Day of June, 2003

JAMES E. ROGAN
*Director of the United States Patent and Trademark Office*